United States Patent [19]

Okitaka et al.

[11] Patent Number: 4,837,463
[45] Date of Patent: Jun. 6, 1989

[54] THREE-STATE COMPLEMENTARY FIELD EFFECT INTEGRATED CIRCUIT

[75] Inventors: Takenori Okitaka; Yukio Miyazaki, both of Hyogo, Japan

[73] Assignee: Mitsubishi Denki Kabushiki Kaisha, Tokyo, Japan

[21] Appl. No.: 129,940

[22] Filed: Dec. 3, 1987

[30] Foreign Application Priority Data

Dec. 4, 1986 [JP] Japan ................. 61-290195

[51] Int. Cl.[4] ............................... H03K 3/295
[52] U.S. Cl. ................. 307/473; 307/443; 307/451; 307/268; 307/279; 307/550
[58] Field of Search .......... 307/473, 475, 443, 451, 307/542, 550, 555, 585, 268, 270, 279, 264

[56] References Cited

U.S. PATENT DOCUMENTS

| 4,295,062 | 10/1981 | Mihalich et al. | 307/279 X |
|---|---|---|---|
| 4,363,978 | 12/1982 | Heimbigner | 307/473 X |
| 4,456,837 | 6/1984 | Schade, Jr. | 307/268 X |
| 4,563,594 | 1/1986 | Koyama | 307/451 X |

FOREIGN PATENT DOCUMENTS 0196113 3/1986 European Pat. Off.
0048616 3/1985 Japan.

OTHER PUBLICATIONS

Bauelemente der Halbleiter–Elektronik—Rudolf Müller, p. 142, (partial translation included), 1973.

Primary Examiner—Stanley D. Miller
Assistant Examiner—Timothy P. Callahan
Attorney, Agent, or Firm—Lowe, Price, LeBlanc, Becker & Shur

[57] ABSTRACT

A three-state complementary field effect integrated circuit comprises an output pre-stage circuit (11) connected to an input terminal (1) and a first and second control input (6, 5) and comprising a series connection of a first switching circuit (9), a second switching circuit (7, 8) having resistances (P5, N5) and a third switching means (10); an output circuit (12) comprising a series connection of a p type and an n type field effect transistors (P1, N1) with capacitors (C1, C2) connected between respective gates and the ground (GND). When the voltages of H and L level are applied to the first and second control input (6, 5), the resistance (P5, N5) comprised in the second switching means and the capacitors (C1, C2) connected to the gates of the transistors constitute integrating circuits. When the output voltage changes, the transistors (P1, N1) are prevented from simultaneously turning on, whereby a through current flowing into the output circuit is prevented.

10 Claims, 2 Drawing Sheets

THREE-STATE COMPLEMENTARY FIELD EFFECT INTEGRATED CIRCUIT

CROSS-REFERENCE TO RELATED, COPENDING APPLICATION

Related, copending application of particular interest to the instant application is U.S. patent application Ser. No. 091,132, entitled "Complementary MOS Integrated Circuit", filed Aug. 31, 1987 and assigned to the same assignee of the present application.

BACKGROUND OF THE INVENTION

1. Field of the Invention

The present invention relates to a three-state complementary field effect integrated circuit and, more particularly, to a three-state complementary field effect integrated circuit comprising an output circuit comprising a series connection of two field effect devices having conductivity types different from each other.

2. Description of the Prior Art

FIG. 1 is a block diagram showing a part of conventional computer system in which, for example, a clock signal is provided from a CPU (Central Processing Unit) to its peripheral circuit. Referring to FIG. 1, a CPU 51 outputs a clock signal cl from a clock output terminal 52 and applies the same to a clock input terminal 55 of a peripheral circuit 54 through an inverter 53. The inverter 53 is a driver circuit for relaying the clock signal cl.

The inverter 53 shown in FIG. 1 is an example of application example of the present invention. Such an inverter is often used as an output circuit for relaying a digital circuit and, in general, operates to receive an input signal having two values and output an output signal having two values.

FIG. 2 is a schematic diagram of an inverter circuit of one example of an output circuit of a conventional CMOS (Complementary Metal Oxide Semiconductor) integrated circuit. The inverter circuit shown in FIG. 2 comprises a series connection of a p type MOS transistor P1 and an n type MOS transistor N1 connected between a terminal 3 of the power, supply Vcc and a terminal 4 of the ground GND. Each of gates of the transistor P1 and the transistor N1 is connected together to an input terminal 13 and a node of the transistor P1 and the transistor N1 constitutes an output terminal 2.

An operation is described. When an input voltage of the level of the ground GND (referred to as L level hereinafter) is applied to the input terminal 13, the transistor P1 turns on and the transistor N1 turns off, with the result that the output terminal 2 is brought to the output voltage of the level of the power supply Vcc (referred to as H level hereinafter). On the contrary, when the input voltage of H level is applied to the input terminal 13, the transistor N1 turns on and the transistor P1 turns off, with the result that the output terminal 2 is brought to the output voltage of L level. When the input voltage applied to the input terminal 13 is at a medium value between H level and L level, both transistors P1 and N1 turn on and a voltage determined by the ratio of an on resistance of the transistor P1 to that of the transistor N1 is outputted from the output terminal 2.

FIG. 3 is a schematic diagram showing an equivalent circuit when the output circuit shown in FIG. 2 is mounted on a printed circuit board. Referring to FIG. 3, an inductance L1 is formed in a connection between the power supply terminal 3 and an external power supply Vcco terminal 19 for receiving the power supply from outside the board and an inductance L2 is formed in connection between the ground terminal 4 and an external ground GNDo terminal 20 for grounding outside the board, both inductance components being formed by an influence from a frame and a gold wire of the integrated circuit and from a wire in the printed circuit board.

Recently, with a demand for a higher speed of operation of the integrated circuit, a current output capacitance (driving capability) of the field effect integrated circuit constituting the output circuit is increased. For example, a certain integrated circuit has an output short-circuit current of 200mA to 300mA under a supply voltage of 5V. An increase of the current output capacitance in the integrated circuit causes an increase of a through current flowing between the power supply and the ground when the output voltage changes, that is, an increase of unnecessary power consumption.

Referring to the equivalent circuit of the output circuit shown in FIG. 3, a spike voltage Vs generated, when the output voltage of the output circuit changes, at the inductance L1 or L2 is represented by $$Vs = -L \frac{dI}{dt}$$

where I is a current flowing into the inductance L1 or L2 and t is a time. Therefore, it follows that the above-mentioned increase in the through current in the output circuit causes an increase in the spike voltage Vs generated at the inductances L1 and L2.

FIG. 4 is a schematic waveform diagram showing a voltage waveform outputted from the output terminal 2 of the equivalent circuit of the output circuit shown in FIG. 3. Referring to the waveform diagram shown in FIG. 4, the ordinate denotes a voltage value of the output and the abscissa denotes the lapse of time. Reference characters $V_{OH}$ and $V_{OL}$ denote voltages of H level and L level outputted from the output terminal 2, respectively. The waveform diagram shown in FIG. 4 denotes that the output voltage includes the spike voltage when the output voltage of the output circuit changes.

There is another problem that this spike voltage, in other words, a spike noise causes malfunction of another circuits connected to this output circuit or existing near this output circuit.

A prior art of interest to a three-state complementary field effect integrated circuit in accordance with the present invention is disclosed in Japanese Patent Laying-Open Gazette No. 48616/1985, entitled "Logic Circuit". This prior art comprises an output pre-stage circuit comprising a composite gate, and the pre-stage circuit enables the output circuit to have three output states in response to an control signal.

SUMMARY OF THE INVENTION

It is a major object of the present invention is to provide a three-state complementary field effect integrated circuit capable of decreasing the magnitude of the spike voltage generated, when the output voltage changes, at the output circuit in the output circuit of the field effect integrated circuit having an increased current output capacitance.

It is another object of the present invention is to provide a three-state complementary field effect integrated circuit in which unnecessary power consumption is decreased.

Briefly stated, the present invention comprises a first series connection connected to an input and a first and second control inputs to which control signals opposite to each other are applied, and having a first switching means, a second switching means having a delay resistance and a third switching means connected in this order between the power supply and the ground; and an output circuit comprising a second series connection connected to the first series connection and between the power supply and the ground, having at least one first field effect device of a certain conductivity type having a control electrode and at least one second field effect device of an opposite conductivity type having a control electrode connected in series. A node at which the first and second field effect devices connected together constitutes an output terminal. One terminal and the other terminal of the second switching means are coupled to respective control electrodes of the first and second field effect devices, respectively. The second switching means applies the delay resistance of the second switching means to the first series circuit in series in response to the control signals applied to the first and second control input. The first switching means is coupled to the input and the first control input, turns on in response to the inputsignal applied to the input and applies the voltage from the power supply to the control electrode of the second field effect device through the second switching means. A first capacitance connected between the control electrode of the second field effect device and a predetermined reference voltage point, and the delay resistance of the second switching means form a first integrating circuit having a first time constant. The second field effect device turns on in response to the voltage applied from the power supply through the first integrating circuit and having the delay determined by the 15 first time constant. The third switching means is coupled to the input and the second control input, turns on in response to the input signal applied to the input and applies the voltage from the ground to the control electrode of the first field effect device through the second switching means. A second capacitance connected between the control electrode of the first field effect device and the reference voltage point, and the delay resistance of the second switching means form a second integrating circuit having a second time constant. The first field effect device turn on in response to the voltage applied from the ground through the second integrating circuit and having the delay determined by the second time constant.

In accordance with the present invention, the first and second field effect devices of the output circuit respectively turn on, when the voltage applied from the ground through the second integrating circuit and the voltage applied from the power supply through the first integrating circuit are applied to respective control inputs of the field effect devices. Since changes of respective voltages applied to the control inputs of respective field effect devices through the integrating circuits have delays determined by the first and second time constants, the first and second field effect devices of the output circuit is conducted with delay. Meanwhile, in a cut-off operation of the first and second field effect devices, since the voltage from the power supply or the ground required for the cut-off is applied to the control electrode of the first or second field effect device not through the second switching means but through the first or third switching means, there is little delay in the cut-off operation. In a normal operation, one of the first and second field effect devices of the output circuit is on and the other is off. When the output voltage of the output circuit changes, i.e., when one field effect device of the first and second field effect devices which is in the on state turns off and the other field effect device which is off state turns on, one field effect device to turn off changes with little delay but the other field effect device to turn on changes with delay. Therefore, both field effect devices in the output circuit can be prevented from turning on at the same time. Even if there is a moment when both field effect devices turn on at the same time, the voltage applied to the control electrode of the field effect device to turn on can rise with a delay brought by the integrating circuit and, therefore, the current flowing into the field effect device can be limited during its rise period. As a result, the through current flowing, when the output voltage changes, from the power supply to the ground in the output circuit can be prevented or decreased by the above-mentioned operation.

In accordance with the present invention, since the through current flowing from the power supply to the ground in the output circuit can be decreased, meritorious effects can be brought about that unnecessary power consumption is decreased and malfunction of other circuits connected to the output circuit is prevented by preventing the spike voltage from generating in the output circuit.

In the preferred embodiment of the present invention, either ground or power supply can be selected as a reference voltage point to which one terminals of the first and second capacitance is coupled.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 5:
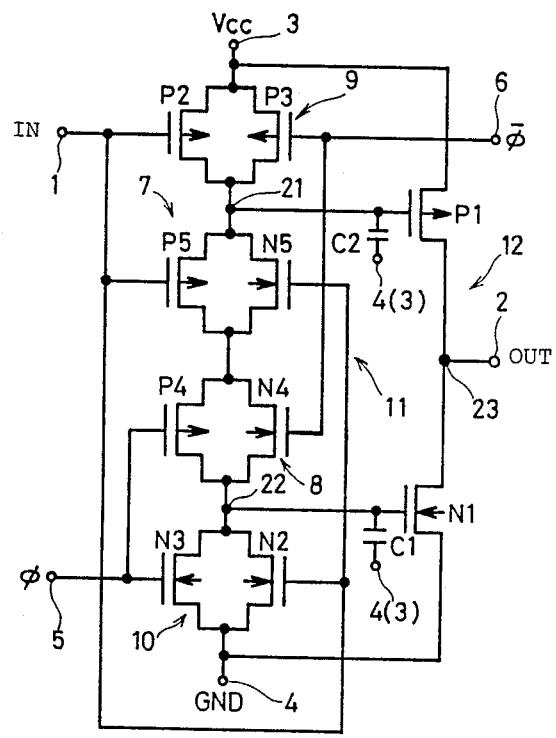
FIG. 5 is a schematic diagram showing one embodiment of a three-state complementary field effect integrated circuit of the present invention.

FIG. 5 is a schematic diagram showing one embodiment of a three-state complementary field effect integrated circuit of the present invention. Referring to FIG. 5, the circuit comprises an output circuit and an output pre-stage circuit connected in parallel between the power supply Vcc and the ground GND. The output pre-stage circuit comprises a series connection having a first switching circuit 9, a second switching circuit 7 and 8 and a third switching circuit 10 connected in series. The first switching circuit 9 comprises a first parallel connection in which a p type MOS transistor P2 having its gate connected to an input terminal 1 and a p type MOS transistor P3 having its gate connected to a first control input terminal 6 are connected in parallel. The second switching circuits 7 and 8 comprise a series connection of the second and third parallel connections 7 and 8, each having respective two transistors connected in parallel. The second parallel connection 7 comprises a p type MOS transistor P5 and an n type MOS transistor N5 having their gates connected to the input terminal 1 together. The third parallel connection 8 comprises a p type MOS transistor P4 having its gate connected to a second control input terminal 5 and an n type MOS transistor N5 having its gate connected to the first control input terminal 6. The third switching circuit 10 comprises a fourth parallel connection in which an n type MOS transistor N3 having its gate connected to the second control input terminal 5 and an n type MOS transistor N2 having its gate connected to the input terminal 1 are connected in parallel. The output circuit comprises a series connection in which a p type MOS transistor P1 having its gate connected to a node 21 to which the first switching circuit 9 and the second switching circuit 7 and 8 are connected, and an n type MOS transistor N1 having its gate connected to an node 22 to which the second switching circuit 7 and 8 and the third switching circuit 10 are connected, are connected in series at a node 23. The node 23 constitutes an output terminal 2. The output pre-stage circuit comprises a first capacitor C1 connected between the node 22 and the ground GND and a second capacitor C2 connected between the node 21 and the ground GND. Control signals $\bar{\phi}$ and $\phi$ of opposite levels are applied to the first and second control input terminals 6 and 5, respectively.

Next, an operation is described. Let it be assumed that the control signal 100 applied to the first control input terminal 6 is the voltage of H level and the control signal $\bar{\phi}$ applied to the second control input terminal 5 is the voltage of L level. Although the transistors P3 and N3 are off, the transistors N4 and P4 turn on in response to the control signals $\bar{\phi}$ and $\phi$, respectively.

When the voltage of the input signal applied to the input terminal 1 changes from H level to L level, both the transistors P2 and P5 turn on in response to the input signal. The voltage of the power supply Vcc is applied to the gate of the transistor N1 through the transistors P2, P5 and P4. At this time, since the integrating circuit is formed in which the time constant is determined by the resistance of the transistor P5 and the transistor P4 and by the capacitor C1 connected between the gate of the transistor N1 and the ground GND, it follows that the voltage with a delay determined by the time constant is applied from the power supply Vcc to the gate of the transistor N1. Therefore, the transistor N1 turns on with a delay in response to the voltage of the gate and provide the voltage of the level of the ground GND to the output terminal 2. Meanwhile, since the voltage of the gate of the transistor P1 is brought to the voltage level of the power supply Vcc as soon as the transistor P2 turns on, the transistor P1 turns off almost at the same time that the voltage applied to the input terminal 1 changes from H level to L level. Therefore, when the above-mentioned transistors N1 and P1 change the operation state, the transistors N1 and P1 hardly turn on simultaneously. Even if there is a moment when the transistors N1 and P1 turn on at the same time, the amount of a drain current of the transistor N1 is limited by the voltage applied with a delay to the gate of the transistor N1. Therefore, the through current flowing between the power supply Vcc and the ground GND when the output voltage changes can be prevented or decreased by an operation of the capacitor C1.

Meanwhile, when the voltage of the input signal applied to the input terminal 1 changes from L level to H level, both the transistors N5 and N2 turn on in response to the input signal. The voltage of the gate of the transistor P1 is discharged to the ground GND through the transistors N5, N4 and N2. At this time, since the integrating circuit is formed in which the time constant is determined by the resistance of the transistors N5 and N4 and by the capacitor C2 connected between the transistor P1 and the ground GND, the voltage of the gate of the transistor P1 is discharged to the ground GND with a delay determined by the time constant. Therefore, the transistor P1 turns on with a delay in response to the voltage of the gate and applies the voltage of the level of the power supply Vcc to the output terminal 2. Meanwhile, since the voltage of the gate of the transistor N1 is discharged to the ground GND as soon as the transistor N2 turns on, that the transistor N1 turns off almost at the same time that the voltage applied to the input terminal 1 changes from L level to H level. Therefore, in the above-mentioned operation of the transistors N1 and P1, the transistors N1 and P1 hardly turn on at the same time. Even if there is a moment when the transistors N1 and P1 turn on simultaneously, the voltage of the gate of the transistor P1 is discharged with a delay and, therefore, the amount of the drain current of the transistor P1 is limited. As a result, the through current flowing between the power supply Vcc and the ground GND when the output voltage changes can be prevented or decreased by an operation of the capacitor C2.

When the voltage of the control signal $\phi$ applied to the first control input terminal 6 is at L and the voltage of the control signal $\phi$ applied to the second control input terminal 5 is at H, the transistors P3 and N3 turn on but the transistors P4 and N4 turn off. Therefore, the output terminal 2 becomes a high impedance state without regard to a change of the voltage level of the input signal applied to the input terminal 1.

Figure 1:
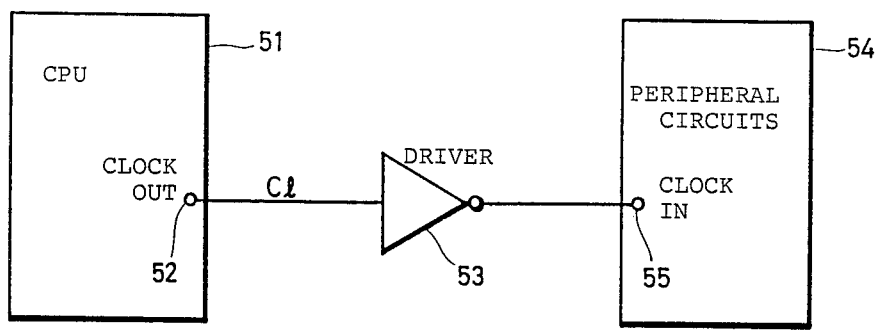
FIG. 1 is a block diagram showing a portion of a simplified connection between a CPU and its peripheral circuit in a conventional computer system.
Figure 2:
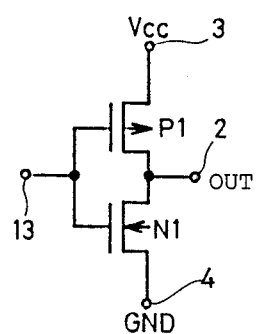
FIG. 2 is a schematic diagram showing one example of an output circuit of a conventional CMOS integrated circuit.
Figure 3:
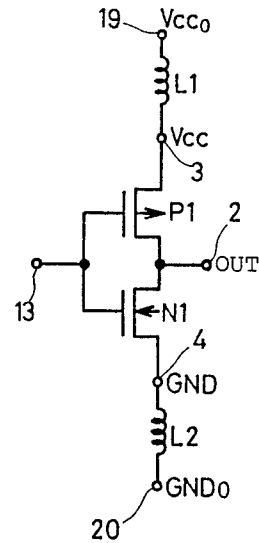
FIG. 3 is a schematic diagram showing an equivalent circuit when the output circuit shown in FIG. 2 is mounted on a printed circuit board.
Figure 4:
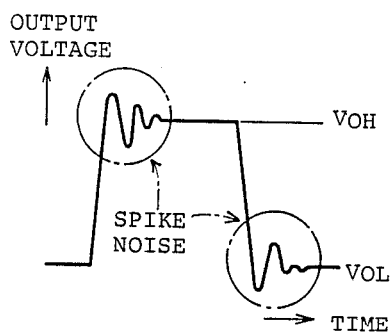
FIG. 4 is a schematic output waveform diagram for showing a voltage waveform outputted from the output of the equivalent circuit of the output circuit shown in FIG. 3.
Figure 6:
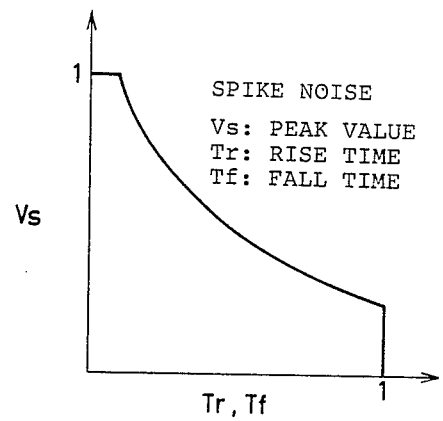
FIG. 6 is a graph showing a relation between a rise and fall time of the output voltage in the three-state complementary field effect integrated circuit shown in FIG. 5 and a peak value of the spike voltage generated in this circuit.

FIG. 6 is a graph showing a relation between a rise and fall time Tr and Tf of the output voltage in the circuit shown in FIG. 5 and a peak value Vs of a spike noise generated by an inductance comprised in this circuit. The rise and fall time of the waveform of the output voltage can be changed by changing the capacitance of the capacitors C1 and C2 of the circuit shown in FIG. 5. In a graph of FIG. 6, assuming that the rise or fall time of the output waveform of the circuit is "1" on the basis of a circuit state to which the capacitors C1 and C2 having certain capacitances are connected, and the peak value Vs of the spike noise generated in the circuit by the change of the output voltage at that time is defined as "1", the relation between the rise and fall time Tr and Tf at another circuit state and the peak value Vs of the spike noise generated in that circuit are shown. This graph is based on the result obtained by an experiment. This graph denotes that if the rise and fall time Tr and Tf of the waveform of the output voltage of the circuit shown in FIG. 5 is made long, it is possible to lower the peak value Vs of the spike noise generated by the inductance in this circuit. Since the rise and fall time Tr and Tf of the output waveform can be made longer by changing the capacitances of the capacitors C1 and C2 of the circuit shown in FIG. 5, it can be seen that the capacitors C1 and C2 are effective in decreasing the peak value Vs of the spike noise.

As described above, the meritorious effects are brought about that the capacitors C2 and C1 connected between respective gates of the p channel and the n channel MOS transistors P1 and N1 comprised in the output circuit and the ground GND as shown in FIG. 5 decrease unnecessary power consumption by decreasing the through current, and also they prevent malfunctions of other circuits caused by this noise by lowering the peak value of the spike noise generated in the circuit.

Although a description was made as to the case in which the capacitors C1 and C2 are connected respectively between the gates of the transistors N1 and P1 and the ground GND in above-mentioned embodiment, the same effect can be obtained even if the capacitors are connected between the gate of the transistors N1 and P1 and the power supply Vcc.

In addition, the same effect is brought about even if the second parallel connection 7 comprising the transistors P5 and N5 in above-mentioned embodiment is replaced with a device having another resistance.

Although a description was made as to the case of an complementary MOS integrated circuit in the above-mentioned embodiment, the same effects is brought about even if the same circuit is constituted by p channel or n channel field effect devices.

As mentioned above, since the present invention comprises the integrating circuits constituted by two capacitances respectively, connected between the control electrodes of the first and second field effect devices of the output circuit and the predetermined reference voltage point, and by the delay resistance of the second switching means, the field effect device of the first and second field effect devices to turn on changes later than the field effect device to turn off when the output voltage of the output circuit changes. Therefore, meritorious effects are brought about that the through current flowing from the power supply to the ground in the output circuit can be decreased and, therefore, unnecessary power consumption is decreased and malfunctions of other circuits connected to the output circuit due to the spike voltage generated in the output circuit can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A three-state complementary field effect integrated circuit comprising:

an input (1);

an output (2);

a first control input (6) and a second control input (5) to which control signals opposite to each other are applied;

a first series connection connected to said input (1) and said first and second control input (6, 5), in which first switching means (9), second switching means (7, 8) having a delay resistance and third switching means (10) are connected in this order between a power supply (Vc) and a ground (GND);

an output circuit comprising a second series connection connected to said first series connection, in which a first field effect device (P1) of a certain conductivity type having a control electrode and a second field effect device (N1) of an opposite conductivity type having a control electrode are connected in series between said power supply (Vcc) and said ground (GND); wherein a node connected to said first and the second field effect devices (P1, N1) constitutes said output (2), one terminal and another terminal of said second switching means are connected respectively to said control electrodes of said first and second field effect devices (P1, N1), said second switching means turns on in response to the control signals applied to said first and second control input (6, 5) and provides said delay resistance to said first series connection in series, said first switching means (9) is coupled to said input (1) and said first control input (6), turns on in response to the input signal applied to said input (I) and applies the voltage from said power supply (Vcc) to said control electrode of said second field effect device (NI) through said second switching means (7, 8); said circuit further comprising a first capacitance (C1) connected between said control electrode of said second field effect device (N1) and a predetermined reference voltage point; wherein said first capacitance (C1) forms a first integrating circuit having a first time constant together with said delay resistance of said second switching means (7, 8), said second field effect device (N1) turns on in response to the voltage applied from said power supply (Vcc) through said first integrating circuit and having a delay determined by said first time constant, said third switching means (10) is coupled to said input (1) and said second control input (5), turns on in response to the input signal applied to said input (1) and applies the voltage from said ground (GND) to said control electrode of said first field effect device (P1) through said second switching means (7, 8); and a second capacitance (C2) connected between said control electrode of said first field effect device (Pl) and said reference voltage point, wherein said second capacitance (C2) forms a second integrating circuit having a second time constant together with said delay resistance of said second switching means (7, 8), and said first field effect device (P1) turns on in response to the voltage applied from said ground (GND) through said second integrating circuit and having a delay determined by said second time constant wherein said second switching means comprises a third series connection of a resistance connection (7) and a fourth switching means (8) having a first on resistance, said fourth switching means (8) turns on in response to the control signal applied to said first and second control inputs (6, 5) and interconnects said first on resistance with said third series connection, and said first on resistance of said fourth switching means (8) and said resistance connection (7) forming said delay resistance.

2. A three-state complementary field effect integrated circuit in accordance with claim 1, wherein said reference voltage point is the ground (GND).

3. A three-state complementary field effect integrated circuit in accordance with claim 1, wherein said reference voltage point is the power supply (Vcc).

4. A three-state complementary field effect integrated circuit in accordance with claim 1, wherein said first, third, and fourth switching means (9, 10, 8) and said resistance connection (7) comprise field effect devices.

5. A three-state complementary field effect integrated circuit in accordance with claim 14, wherein said resistance connection (7) comprises a first parallel connection of a third field effect device (P5) of a certain conductivity type and a fourth field effect device (N5) of an opposite conductivity type both having a second on resistance, and said third and fourth field effect devices (P5, N5) being coupled together to said input (1) and at least one of said third and fourth field effect devices (P5, N5) turning on and interconnecting said second on resistance with said third series connection.

6. A three-state complementary field effect integrated circuit in accordance with claim 4, wherein said fourth switching means (8) comprises a second parallel connection of a fifth field effect device (P4) of a certain conductivity type and a sixth field effect device (N4) of an opposite conductivity type both having said first on resistance, said fifth field effect device (P4) being coupled to said second control input (5), and turning on in response to the control signal applied to said second control input (5), said sixth field effect device (N4) being coupled to said first control input (6) and turning on in response to the control signal applied to said first control input (6), and said fifth and sixth field effect devices (P4, N4) turning on together, whereby said first on resistance is interconnected with said third series connection.

7. A three-state complementary field effect integrated circuit in accordance with claim 1, wherein said first switching means comprises a parallel connection of a seventh field effect device (P2) and an eighth field effect device (P3) of a certain conductivity type, said seventh field effect device (P2) being coupled to said input (1), turning on in response to the input signal applied to said input (1) and applying the voltage from the power supply (Vcc) to said second switching means (7, 8); and said eighth field effect device (P3) being coupled to said first control input (6), turning on in response to the control signal applied to said first control input (6) and bringing said control electrode of said first field effect device (P1) to the voltage of the level of the power supply (Vcc).

8. A three-state complementary field effect integrated circuit in accordance with claim 1, wherein said third switching means comprises a fourth parallel connection of a ninth field effect device (N2) and a tenth field effect device (N3) of an opposite conductivity type;

said ninth field effect device (N2) being coupled to said input (1), turning on in response to the input signal applied to said input (1) and providing a voltage from the ground (GND) to said second switching means (7, 8); and said tenth field effect device (N3) being coupled to said second control input (5) and turning on in response to the control signal applied to said second control input (5) and bringing said control electrode of said second field effect device (N1) to the voltage of the ground (GND) level.

9. A three-state complementary field effect integrated circuit in accordance with claim 8, wherein said certain conductivity type is p type and said opposite conductivity type is n type.

10. A three-state complementary field effect integrated circuit in accordance with claim 8, wherein said first through tenth field effect devices comprises MOS (Metal Oxide Semiconductor) transistors.

* * * * *